United States Patent
Wagenleitner et al.

(10) Patent No.: US 12,510,834 B2
(45) Date of Patent: Dec. 30, 2025

(54) METHOD AND DEVICE FOR THE ALIGNMENT OF SUBSTRATES

(71) Applicant: EV Group E. Thallner GmbH, St. Florian am Inn (AT)

(72) Inventors: Thomas Wagenleitner, Aurolzmünster (AT); Harald Rohringer, Tumeltsham (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 249 days.

(21) Appl. No.: 17/631,261

(22) PCT Filed: Aug. 23, 2019

(86) PCT No.: PCT/EP2019/072589
§ 371 (c)(1),
(2) Date: Jan. 28, 2022

(87) PCT Pub. No.: WO2021/037328
PCT Pub. Date: Mar. 4, 2021

(65) Prior Publication Data
US 2022/0301907 A1    Sep. 22, 2022

(51) Int. Cl.
*G03F 9/00* (2006.01)
*G03F 7/00* (2006.01)
(Continued)

(52) U.S. Cl.
CPC ........ *G03F 9/7088* (2013.01); *G03F 7/70775* (2013.01); *G03F 7/7085* (2013.01); *H01L 21/67259* (2013.01); *H01L 21/681* (2013.01)

(58) Field of Classification Search
CPC ............. H01L 21/68259; H01L 21/681; H01L 21/67092; H01L 23/544;
(Continued)

(56) References Cited

U.S. PATENT DOCUMENTS 5,175,774 A * 12/1992 Truax ........................ B44B 7/00
257/E23.179
5,418,613 A * 5/1995 Matsutani ............. G03F 9/7092
250/548
(Continued)

FOREIGN PATENT DOCUMENTS

JP    2001-332490 A    11/2001
JP    2005251972 A     9/2005
(Continued)

OTHER PUBLICATIONS

English translation of WO-2010038454-A1, published Apr. 8, 2010. (Year: 2010).*
(Continued)

*Primary Examiner* — Christina A Riddle
(74) *Attorney, Agent, or Firm* — RENNER, OTTO, BOISSELLE & SKLAR, LLP

(57) ABSTRACT

A device and a method for the alignment of substrates. The device includes a first substrate holder for receiving a first substrate that has at least two alignment marks, a second substrate holder for receiving a second substrate that has at least two alignment marks, at least one alignment optic for detecting the alignment marks of the first and second substrates, and at least one positioning optic for detecting positioning marks, wherein the alignment marks of the first substrate and the alignment marks of the second substrate can be aligned with one another depending on the positioning marks. The method of alignment includes the steps of fixing the first and second substrates on respective first and second substrate holders, detecting alignment marks on the substrates, detecting positioning marks, and aligning the alignment marks of the substrates with one another in dependence on the positioning marks.

24 Claims, 7 Drawing Sheets

(51) Int. Cl.
*H01L 21/67* (2006.01)
*H01L 21/68* (2006.01)

(58) Field of Classification Search
CPC ......... H01L 2223/544–54426; G03F 7/70775; G03F 7/7085; G03F 7/20; G03F 7/2022; G03F 7/2032; G03F 7/70; G03F 7/70483–70541; G03F 7/70608–70683; G03F 7/708; G03F 7/70808; G03F 7/70975; G03F 7/70991; G03F 9/7088; G03F 9/00; G03F 9/70; G03F 9/7003; G03F 9/7007; G03F 9/7019; G03F 9/7023; G03F 9/7038; G03F 9/7065; G03F 9/7069; G03F 9/7073; G03F 9/7084; G03F 9/7096
USPC ........ 355/18, 30, 52–55, 67–77, 133; 438/5; 356/399–401
See application file for complete search history.

(56) References Cited

U.S. PATENT DOCUMENTS

| | | | |
|---|---|---|---|
| 6,214,692 B1 | 4/2001 | Thallner | |
| 7,134,188 B2* | 11/2006 | Fukunaga | H05K 13/0812 29/739 |
| 8,454,771 B2 | 6/2013 | Horikoshi | |
| 9,299,620 B2 | 3/2016 | Horikoshi | |
| 2001/0055117 A1 | 12/2001 | Mizutani | |
| 2006/0141743 A1* | 6/2006 | Best | H01L 25/50 257/E21.705 |
| 2007/0031993 A1* | 2/2007 | Nemets | H01L 21/681 257/E23.179 |
| 2007/0252994 A1 | 11/2007 | Bijnen et al. | |
| 2010/0139836 A1* | 6/2010 | Horikoshi | H01L 23/544 156/64 |
| 2012/0237328 A1* | 9/2012 | Figura | H01L 21/67259 414/800 |
| 2012/0255365 A1 | 10/2012 | Wimplinger | |
| 2013/0244350 A1 | 9/2013 | Horikoshi | |
| 2016/0155721 A1 | 6/2016 | Sugakawa et al. | |
| 2019/0198371 A1 | 6/2019 | Wagenleitner et al. | |
| 2019/0265595 A1* | 8/2019 | Funabashi | G03F 7/70191 |

FOREIGN PATENT DOCUMENTS

| | | | | |
|---|---|---|---|---|
| JP | 2014013916 A | | 1/2014 | |
| JP | 2014-30025 A | | 2/2014 | |
| JP | 2014-167472 A | | 9/2014 | |
| WO | WO-2010038454 A1 | * | 4/2010 | ........... H01L 21/681 |
| WO | WO 2011/042093 A1 | | 4/2011 | |
| WO | WO 2014/202106 A1 | | 12/2014 | |
| WO | WO 2015082020 A1 | | 6/2015 | |
| WO | WO 2017/162272 A1 | | 9/2017 | |
| WO | WO 2018/028801 A1 | | 2/2018 | |
| WO | WO 2019/057286 A1 | | 3/2019 | |

OTHER PUBLICATIONS

International Search Report from corresponding International Patent Application No. PCT/EP19/72589, dated Apr. 24, 2020.
Notification of Reasons for Refusal issued in related Japanese Patent Application No. 2022-506269 dated Oct. 24, 2023.

* cited by examiner

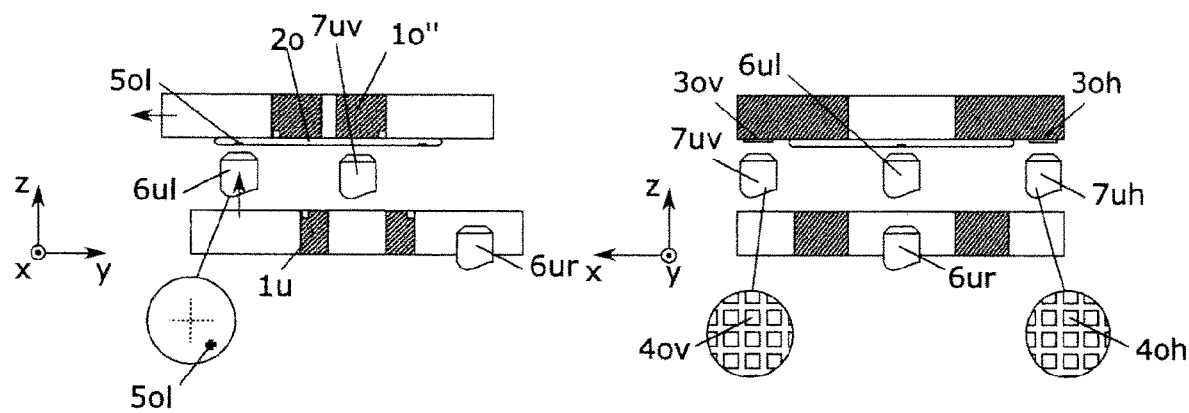
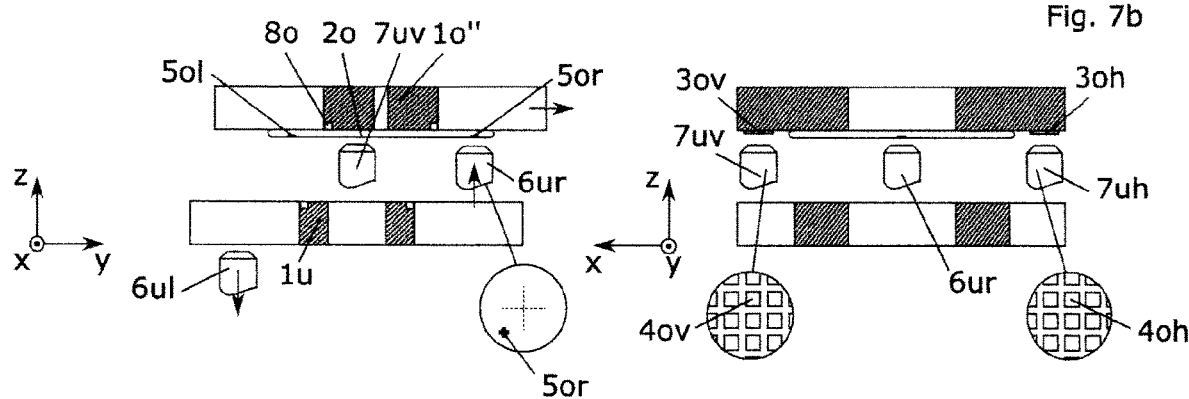
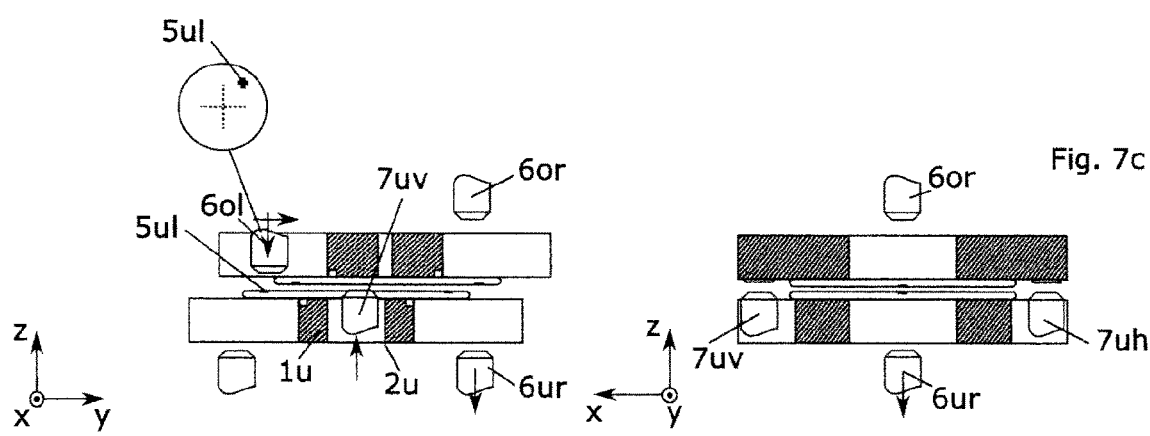
Fig. 7a
Fig. 7b
Fig. 7c

METHOD AND DEVICE FOR THE ALIGNMENT OF SUBSTRATES

FIELD OF THE INVENTION

The present invention relates to a device and a method for the alignment of substrates

BACKGROUND OF THE INVENTION

There are numerous alignment systems in the prior art. Very many of the alignment systems are based on inserting a measuring device between the two substrates for measuring the alignment marks. The drawback with such alignment systems consists in the fact that the measuring device introduced between the substrates can contaminate the substrate surface of the lower substrate. A further, still greater drawback consists in the fact that the measuring device has a certain height. The two substrates therefore have to be moved apart from one another at least by this height. After the measuring device has measured the two substrate surfaces and been removed, the substrates still have to make an approach towards one another and in fact over the entire distance between the substrates. During this approach, a new displacement can already take place in the lateral direction between the substrates and therefore again invalidate the previously measured and adjusted lateral alignment of the substrates with respect to one another.

A further development in the prior art are alignment systems in which the substrate surfaces of the substrates facing one another are separated from one another by only a few millimetres, preferably even only a few micrometres, most preferably even only a few nanometres. This small spacing does not permit insertion of a measuring device. In order however to be able to align the substrates with one another with the aid of their alignment marks, the substrates have to be displaced laterally relative to one another. The alignment marks are then measured in the laterally displaced state by a plurality of lenses and the positions of the substrate holders, which have to be occupied in order to bring the alignment marks exactly into alignment, are calculated. Such alignment systems are dealt with comprehensively in publications US621469261, WO2014202106A1, WO2015082020A1 and WO2011042093A1. Substrate holders, which can be positioned very precisely, are a prerequisite for such alignment systems. Furthermore, the position of the substrate holders must also be able to be measured precisely at each point in time.

The greatest problem in the prior art consists in the fact that the substrates have to be brought into position by means of the substrate holders and this positioning can only take place as precisely as the substrate holders can be controlled or their precise position measured. Since the lateral path that the substrate holders cover amounts to several millimetres up to centimetres, an in particular reproducible positioning in the micrometre or nanometre range is very difficult to achieve. Very precise position measuring systems are required, in particular interferometers, which can be correspondingly expensive, maintenance-intensive and error-prone.

SUMMARY OF THE INVENTION

It is an object of the present invention to provide a method and a device which at least partially eliminate, in particular completely eliminate, the drawbacks mentioned in the prior art. In particular, it is an object of the invention to provide an improved method and device for aligning two substrates with one another, in particular precisely.

The present object is solved with the features of the independent claim(s). Advantageous developments of the invention are indicated in the dependent claims. All combinations of at least two features indicated in the description, in the claims and/or the drawings also fall within the scope of the invention. With the indicated value ranges, values also lying within the stated limits should also be deemed to be disclosed as limiting values and can be claimed in any combination.

Accordingly, the invention relates to a device for the alignment of substrates, comprising:
- a first substrate holder for receiving a first substrate, wherein the first substrate comprises at least two alignment marks,
- a second substrate holder for receiving a second substrate, wherein the second substrate comprises at least two further alignment marks,
- at least one alignment optic for detecting the alignment marks, wherein
- the device further comprises:
- at least one positioning optic for detecting positioning marks, wherein the alignment marks of the first substrate and the further alignment marks of the second substrate can be aligned with one another depending on the positioning marks.

During the alignment of the substrates or of the alignment marks of the substrates, the positioning marks can be used for a precise alignment. The position of the alignment marks can be determined relative to the positioning marks and an actuation of the substrate holders can advantageously be carried out by means of the positioning marks serving as a reference. An alignment by means of the alignment marks is thus advantageously not required, so that the alignment can also be carried out with precision when the alignment marks are not accessible for the alignment optics, in particular when the substrates and therefore the alignment marks are arranged very close to one another. In particular, the position during the alignment of the substrates, especially of alignment marks which are arranged on the substrates, can be determined when the substrates are arranged one upon the other and the substrate surfaces facing one another are only a few millimetres, in particular only a few nanometres, away from one another. Furthermore, a standard alignment system can advantageously be extended easily and favourably by the aspects according to the invention. Furthermore, the lateral path through which the substrates are moved in the alignment process can advantageously be kept as small as possible.

Furthermore, the invention relates to a method for the alignment of two substrates, in particular using the device for the alignment of substrates, with at least the following steps, in particular with the following sequence:
i) fixing of two substrates on a substrate holder in each case,
ii) detection of alignment marks on the substrates,
iii) detection of positioning marks,
iv) alignment of the alignment marks of the substrates with one another in dependence on the positioning marks.

During the alignment, the position of the alignment marks is first detected following fixing of the substrates. At the same time or subsequently, the position of the alignment marks is connected to or put into a relationship with the position of the positioning marks. No relative movement of the substrates preferably takes place during the fixing of the reference. An alignment of the substrates or the alignment marks arranged on the substrates can then advantageously take place by means of the positioning marks.

In a preferred embodiment of the invention, provision is made such that the alignment marks of the substrates can be aligned with one another by means of the positioning marks, when one or more of the at least two alignment marks of the first substrate is concealed by the second substrate for the at least one alignment optic and/or when one or more of the at least two further alignment marks of the second substrate is concealed by the first substrate for the at least one alignment optic. The alignment can thus also advantageously take place in the concealed state by means of the positioning marks serving as a reference. In particular, a movement of the substrates during the alignment in order to detect the position of the alignment marks is no longer necessary. Relative movements over large distances can thus be avoided. The alignment can thus be carried out particularly precisely.

In another preferred embodiment of the invention, provision is made such that a positioning mark field is formed by the, in particular regularly arranged, positioning marks, wherein in particular the position of different positioning marks relative to one another, in particular in the positioning mark field formed by the positioning marks, is known. The positioning marks are preferably arranged regularly in the positioning mark field. The positioning marks of a positioning mark field are preferably arranged beside one another in a plane. It is also conceivable that a plurality of positioning mark fields are formed with in each case a plurality of positioning marks on the device. In particular, the position of the individual positioning marks or the location of the individual positioning marks in the field is known. With each positioning mark, the location of another positioning mark can thus advantageously be detected. Furthermore, it is advantageously not necessary for the positioning optic to have to be moved relative to the positioning mark field. On the contrary, the positioning optic can also remain at the desired position and the alignment can take place by a movement of the substrate holder. Furthermore, the reference of the alignment mark can advantageously be set to or put into correlation with different positioning marks. In particular, the position can be calculated, since the location of the positioning mark detected in each case by the positioning optic is known with respect to other positioning marks.

The length of the positioning mark field is greater than 0.1 mm, preferably greater than 1 mm, still more preferably greater than 10 mm, most preferably greater than 100 mm, with utmost preference greater than 300 mm.

The width of the positioning mark field is greater than 0.1 mm, preferably greater 1 mm, still more preferably greater than 10 mm, most preferably greater than 100 mm, with utmost preference greater than 300 mm.

Furthermore, provision is advantageously made to generate relatively large positioning mark fields, so as to be able to cover a very large displacement path of the substrate holders. Through the use of large positioning mark fields, it is thus advantageously possible to be able to carry out a precise position determination of the substrate holder at each point in time.

In another advantageous embodiment of the invention, provision is made such that the positioning marks are formed by a multiplicity of, in particular irregularly arranged, fine-positioning elements. In particular, the arrangement of fine-positioning elements is known. Fine positioning can thus advantageously take place during the alignment by means of the fine-positioning elements. The individual fine-positioning elements can also be detected by the positioning optic. Provision is in particular made such that the fine positioning takes place by means of the fine-positioning elements of a positioning mark. Provision is in particular made such that a positioning mark comprises a specific fine-positioning element, which can be regarded and detected as a coordinate origin. The distance or the location of each individual fine-positioning element relative to the specific fine-positioning element of the positioning mark can thus advantageously be determined. The determination in the correlation with the position of the alignment mark is thus advantageously possible in a precise manner. Furthermore, the alignment of the alignment marks or of the substrates with one another can advantageously also be carried out in this way.

In another preferred embodiment of the invention, provision is made such that each positioning mark is formed differently, wherein in particular the positioning marks have a specific information content, which is detectable in particular by the positioning optic. By means of the differently formed positioning marks, the respective positioning mark can be detected and assigned to a location in the positioning mark field. This is preferably enabled by the differently arranged fine-positioning elements. In particular, through the arrangement of the fine-positioning elements, the positioning mark itself can therefore have an information content. In particular, the information content is known or can be stored in a memory. After the detection of the positioning mark, the precise location of the respective positioning mark in the mark field in particular is therefore known. Advantageously, once the detected positioning mark has been set as a reference with respect to an alignment mark, the alignment of the substrates with one another can already be carried out on this basis.

In another preferred embodiment of the invention, provision is made such that the positioning marks have one or more of the following characteristic forms:
   QR Code
   bar code
   geometrical, in particular three-dimensional, figure,
   character string, in particular letter sequence and/or number sequence, preferably binary code,
   image.

Through the different characteristic forms, a differing level of information content can be stored in the positioning mark. The use of a QR code is preferably provided. A precise alignment of the substrates with respect to one another can advantageously take place with different process parameters.

In another preferred embodiment of the invention, provision is made such that at least one substrate holder and/or the at least one positioning optic can be moved in at least two directions, in particular in the x-direction and the y-direction. In order to produce the correlation between alignment marks and positioning marks, it is in particular necessary for at least one substrate holder and/or the at least one positioning optic to be moved relative to the respective substrate surface and/or to the positioning marks. For this purpose, openings can in particular also be provided in the substrate holder, which make it possible for the fixed and/or mobile optics to detect the respective marks through the substrate holder. In this way, the lateral movement of the substrates relative to one another can advantageously be kept as small as possible during the alignment.

In another preferred embodiment of the invention, provision is made such that the positioning marks are arranged laterally beside at least one of the substrates, so that in particular the alignment marks of the substrates can be aligned with one another when the alignment marks of the one substrate are concealed for the at least one alignment optic by the other substrate. In particular, when the substrates are arranged one upon the other, are approximately in alignment in the axial direction and the substrate surfaces to be bonded are arranged very close to one another, the alignment marks arranged on the substrates are concealed by the respective other substrate. The positioning marks are advantageously arranged outside the substrate on the plane formed by the respective substrate surface and are therefore not concealed. An alignment by means of the positioning marks can thus advantageously take place, even when the substrates are arranged very close to one another.

In another preferred embodiment of the invention, provision is made such that the positioning marks are arranged on at least one of the substrate holders. The positioning marks are preferably arranged on the respective substrate holder. The position of the positioning marks can thus advantageously be connected directly with the movement of the respective substrate holder. The movement or position of the positioning marks detected by the positioning optic is in particular directly coupled with the movement of the respective substrate holder. An alignment can thus advantageously be carried out precisely.

In another preferred embodiment of the invention, provision is made such that the positioning marks are arranged on at least one substrate holder surface. The positioning marks are preferably arranged on the substrate holder surface. The view of the positioning marks for the positioning optics is thus not hindered by other parts arranged on the substrate holder.

In another preferred embodiment of the invention, provision is made such that the positioning marks are arranged at the same level as a substrate surface of at least one of the substrates. The alignment marks preferably arranged of the substrate surface preferably lie at the same level as the positioning marks. A respectively adjusted focal point for the positioning optic and the alignment optic can thus advantageously be set identical. Especially when the positioning optic and the alignment optic use the same focusing unit. In addition, the alignment marks and the positioning marks set as a reference then lie at the same axial level. The substrate holder thus needs to be moved in particular only in the x-direction and/or y-direction for the alignment.

In another preferred embodiment of the invention, provision is made such that the positions of the alignment marks of the substrates can be detected, in particular continuously, by the at least one positioning optic during the alignment of the alignment marks of the substrates with one another. Advantageously, the current position of the substrates can be determined at each point in time after the alignment marks and the positioning marks have been connected by the positioning optic. Advantageously, other additional process steps are thus also able to use the precise position information of the substrates. Continuous checking of the position during the movement of the substrate holders and/or of the positioning optic can also advantageously record deviations from a specified or desired position. Early error detection is thus possible during the alignment.

The invention describes a method and a device for the alignment of substrates. The alignment marks at which the two substrates are aligned with one another are located on the substrate surfaces facing one another. The alignment marks of each substrate are thus concealed, in particular at the latest during bonding, by the respectively opposite substrate. The idea describes the use of at least one positioning mark field, in particular a QR field, with the aid of which the positioning accuracy of the substrate holders and therefore of the substrates fixed therein can be increased. As a result of this aspect, it is possible to calculate precisely the position of the alignment marks with respect to one another, without the alignment marks having to be observed. The idea is described comprehensively for three types of alignment system.

The essence of the invention consists in particular in providing a device and a method, with the aid of which an alignment of two substrates takes place on the basis of their alignment marks using a system of optics. The optics are the alignment optics known from the prior art, with the aid of which the alignment marks are improved. According to the invention, at least one in particular additional positioning optic is used, with the aid of which at least one positioning mark field, in particular a QR mark field, can be measured optically. The positioning mark field is used as a reference field in order to be able to determine the exact position of the substrate holders and therefore of the substrates.

Whilst it is still always necessary to carry out a lateral displacement of the substrate holders with the method and the corresponding device, the current actual position of a substrate holder is however detected by a number of positioning marks, in particular QR marks, of the positioning mark field at least at the point in time at which the alignment marks are no longer visible or can no longer be detected by the alignment optics. The positioning marks are readable and interpretable by software and/or hardware and/or firmware. Interpretable means that coarse positioning data is encoded in the marks themselves. The fine positioning can then be carried out using the pixel position.

With the aid of the device and the corresponding method, it is possible continuously to track or correctly calculate the exact position of the alignment marks not by measuring the alignment marks themselves, but by measuring the positioning marks, in particular in the state in which the alignment marks are concealed by the respective opposite substrate.

The idea is in particular an extension, preferably a replacement, for more expensive, more error-prone and more maintenance-intensive position measuring systems, in particular interferometers.

A further decisive advantage consists in the fact that the idea can readily be used on existing systems and can extend the latter.

A completely new development of an alignment system is therefore not necessarily required.

The idea is based for example on the alignment systems from publications U.S. Pat. No. 6,214,692B1, WO2014202106A1, WO2015082020A1 and WO2011042093A1. The description of these alignment systems will therefore only the dealt with superficially, but the idea will be described comprehensively on the basis of three methods which can be assigned to the alignment systems, in order to demonstrate the flexibility of the idea.

It is decisive that all the alignment systems, in particular those of the aforementioned publications, can be extended by the aspects according to the invention. The idea thus consists primarily in using a positioning mark field, in particular a QR mark field, and at least one additional positioning mark optic in order to measure the positioning marks of the positioning mark field at a given point in time, whilst at the same time the position of the least one alignment mark is measured with an alignment optic. Since the at least one positioning mark optic is no longer moved relative to the alignment optics, the position of an alignment mark, even when the latter is concealed, can always be calculated by measuring a positioning mark of the positioning mark field and is therefore known.

Marks

In order to describe the idea in the best possible way, a distinction is made between alignment marks and positioning marks.

Alignment Marks

Alignment marks are understood to mean marks which have been applied or produced on the substrates and which have to be brought into alignment in the process, in particular have to be aligned exactly with one another. Alignment marks are used for the exact positioning of two substrates with one another. The alignment of two substrates by means of their alignment marks is all the more effective, the smaller the distance between the alignment marks of the two substrates. A so-called back-to-back alignment, wherein the alignment marks are located on the rear sides of the substrates, is therefore less effective than a so-called face-to-face alignment, wherein the alignment marks are located on the substrate surfaces which are to be connected and are in particular facing one another. A drawback with the face-to-face alignment, however, is that the alignment marks on a first substrate surface of a first substrate are concealed by the respectively opposite, second substrate, inasmuch as the alignment marks are located in the immediate vicinity of one another. If measurement methods are selected in which the substrate cannot be measured by transmission, it is impossible to detect the alignment marks in this state and therefore also impossible to align the substrates correctly with one another. Although an infrared measurement with some substrates would in principle represent a possible option for aligning the substrates with one another, this measuring method very often cannot however be used due to a metallic coating of the substrates. Metals are basically non-transparent for infrared. The only possible options that remain, therefore, are those in which the alignment marks are measured in a state in which the respectively opposite substrate is displaced, in order to align the substrate holders and therefore the substrates with one another after the measurement of the alignment marks by means of a high-precision positioning process.

The precise form of the alignment marks does not need to be dealt with in greater detail, since there are countless types of alignment marks in the industry. Alignment marks are represented simplified as black crosses in the figures of this publication.

Positioning Marks

Positioning marks are understood to mean marks which are tracked, observed and evaluated, in particular continuously, by means of additional optics, the positioning optics, in order to be able to determine the exact position of the substrate holders and therefore of the substrates even when the alignment marks on a substrate are concealed by the respectively opposite substrate and are therefore no longer optically accessible.

The positioning marks are preferably located on the substrate holder.

Each positioning mark is preferably produced such that a, in particular coarse, position can be read out from it. Particularly suitable as positioning marks are QR codes
Barcodes,
Text
Symbols
Etc.

In a QR positioning mark, a coarse position is in particular directly encoded in the QR code. The positioning marks represented in the figures of the publication are QR codes. The QR codes can be read out for a better understanding of the publication with a standard commercial QR scanner, for example a camera of a smart phone. An understanding of the coarse positioning will thus be facilitated for the person skilled in the art who reads this publication.

A barcode positioning mark could store the coarse position encoded as an integer. It would for example be conceivable for the integer 101012 to stand for the coarse position (101,012). It will be agreed that the first n of N figures correspond to the x-coordinate and the last N-n figures to the y-coordinate.

If a text is used as a positioning mark, the coarse position can be represented directly as text. It would be conceivable for example to use the text fragment "101,12" to fix the coarse position (101,12).

In the case of the symbolic positioning marks, an assignment table is in particular required. A special symbol is assigned to a coarse position (x, y). It would also be conceivable for a symbolic positioning mark to consist of two partial symbols, whereof each partial symbol corresponds to a coordinate which has been established in a corresponding table.

Furthermore, each positioning mark preferably comprises fine-positioning elements, by means of which an individual fine position can be assigned to the positioning mark. The position encoded in the positioning mark is generally not sufficient to carry out fine positioning.

Fine-positioning elements can for example be a frame which surrounds the positioning mark. Rectangles, in particular squares, would for example be conceivable. Symmetrical octagons or circles would also be conceivable. The fine-positioning elements can be detected and evaluated by hardware and/or software and/or firmware, such that a local zero point for the positioning mark can be acquired therefrom, which is limited only by the pixel resolution of the detector. By means of the relative displacement of this zero point relative to the optical axis of the positioning optic, the fine adjustment is then enabled, and therefore in particular a precise alignment of the substrates is possible or a calculation for the determination of the exact position of the alignment marks and therefore of the exact position of the substrates, which in particular are fixed on the substrate holders. It would also be conceivable for individual features of the positioning mark, for example corners or edges, to serve themselves as fine-positioning elements.

Positioning Mark Field

The positioning marks are in particular part of a positioning mark field. The positioning marks are arranged in particular symmetrically, in particular along a grid, in the positioning mark field. The positions encoded in the positioning marks are given relative to a coordinate origin of the positioning mark field.

In the ideal case, the positioning mark field should be produced on a surface of a body which changes only very slightly, preferably not at all, in its shape under the effect of any change in a physical parameter such as pressure and temperature. The body on which a positioning mark field is produced should therefore have a thermal expansion coefficient tensor, the coefficient whereof is as small as possible. The body is preferably produced from a material with a cubic crystal system, because in this case the thermal expansion is always isotropic. Instead of an expansion coefficient tensor, use can simply be made of a thermal expansion coefficient in this case.

The body should be as insensitive as possible to adsorbates, in particular not oxidise or enter into any other chemical reactions that lead to a layer formation. In particular, nanometre thin oxide layers can have very pronounced optical properties, which can have an unfavourable effect on the reading-out of the positioning marks. These include for example an interference effect, light refraction etc.

In a very particularly preferred embodiment, a positioning mark field is located approximately at the same level as the alignment marks to be measured, in particular in a plane which passes through the substrate surface on which the alignment mark is arranged.

In a less preferred embodiment, the positioning mark field is located on the substrate holder outer surface lying opposite the substrate holder fixing surface and is thus relatively far away from the plane in which the alignment marks are located.

An individual coordinate system (positioning mark field coordinate system PMFKS) with a corresponding xP-axis and a yP-axis preferably orthogonal thereto is preferably present in respect of the positioning mark field. One of the positioning marks is preferably a positioning mark which defines the zero point of this PMFKS.

The creation of a positioning mark field is in particular always associated with inaccuracies. It is always the case that each product of a production operation can only be produced with the accuracy and the precision of the production machine. It is therefore important to mention that the positioning mark field does not have to be produced isotropic and/or homogeneous over the entire area. It is fully adequate if the positioning marks, which have been associated with the alignment marks, do not change during the alignment process.

Nonetheless, an attempt is of course preferably made to obtain positioning mark fields which are produced as accurately and precisely as possible over the entire positioning mark field area.

Optics

In the subsequent text, a distinction will generally be made between alignment optics and positioning optics. Alignment optics are understood to mean all optics which detect the alignment marks, whereas positioning optics are understood to mean all optics which measure the positioning marks. In special embodiments, optics are used which are used simultaneously as alignment and positioning optics. In these cases, the two words are used synonymously. Since the aspect of the idea is however based on a development of alignment systems which always already have alignment optics, the word positioning in such a case is used to create continuity and consistency.

The word optic is used in the subsequent text as a synonym for a, generally very complicated, optical system, i.e. for a number of optical elements, with the aid of which an image can be taken, in particular magnified. The optics are symbolised in the figures by simple optics. Further optical elements such as prisms, various lenses, optical filters, mirrors etc. can lie behind these optics. The optics project an image that has been taken onto a chip, in particular a CMOS chip, which duly further processes the image and in particular transmits it to software.

All the optics can be moved generally in translation and/or rotation. After a suitable calibration of the optics, however, the latter are preferably no longer moved. A relative movement between the optics and the substrate holders then takes place only through the movement of the substrate holders. In particular, the focal planes or focal points and/or the depth of focus range of the optics are adjustable and are preferably no longer changed after calibration onto a plane. An exception is primarily the optics of the subsequently mentioned and comprehensively described type 3 alignment system, which is mentioned comprehensively in publication WO2015082020A1. In this alignment system, it is necessary actively to move the optics precisely to achieve the desired alignment result.

Position Determination

The method permits the exact positioning of a substrates holder, and therefore of a substrate, by measuring a positioning mark field and the exact control of a position of the positioning mark field. In order to enable an exact control of the substrate holder, it is not sufficient to read out the coarse position from a positioning mark of the positioning field, since this only gives a position which lies well above the possible optical resolution limit. As soon as a positioning mark of a positioning mark field is located in the field of vision of a positioning optic, a zero point of the positioning mark can be measured. The fine positioning of the substrate holder then takes place by the distance measurement between the zero point of the positioning optic and the zero point of the positioning mark. This fine positioning is limited by the pixel resolution of the detector, inasmuch as the pixel resolution is worse than the optical resolution, otherwise the resolution limit is the optical resolution. During a movement of a substrate holder, the positioning optic, in cooperation with hardware and/or software and/or firmware, must therefore only be in a position to be able to read out the coarse position of the substrate holder by reading out the positioning marks passing through its field of vision. As soon as a desired coarse position has then been reached, the fine positioning can take place by means of the pixel measurement. In this measurement step, the substrate holder in particular does not move at all or so slowly that a measurement of all the necessary positioning mark features is possible.

Substrate Holder

A substrate holder in particular comprises a substrate holder fixing surface and a substrate holder outer surface lying opposite the substrate holder fixing surface.

The substrate holders comprise fixings. The fixings serve to hold the substrate firm. The fixings can be 1. Mechanical fixings, in particular
   1.1. Clamps
2. Vacuum fixings, in particular with
   2.1. individually controllable vacuum tracks
   2.2. Vacuum tracks connected to one another
3. Electrical fixings, in particular
   3.1. Electrostatic fixings
4. Magnetic fixings
5. Adhesive fixings, in particular
6. Gel-Pak fixings
7. Fixings with an adhesive, in particular controllable, surface.

The fixings are in particular electronically controllable. The vacuum fixing is the preferred type of fixing. The vacuum fixing preferably comprises a plurality of vacuum tracks which emerge at the surface of the substrate holder. The vacuum tracks are preferably individually controllable. In one application, several vacuum tracks are combined to form vacuum track segments, which can be individually controlled, i.e. can be evacuated or flooded. Each vacuum segment is in particular independent of the other vacuum segments. The possibility of constructing individually controllable vacuum segments is thus achieved. The vacuum segments are preferably designed in an annular shape. A targeted, radially symmetrical fixing and/or release of the substrate from the substrate holder, in particular carried out from the inside outwards, is thus enabled.

The substrate holder can be a substrate holder from one of the publications WO2017162272A1, WO2018028801A1 and WO2019057286A1 extended by the properties according to the invention. In particular, the substrate holder is a substrate holder with individually controllable zones and fixing elements according to the embodiment of WO2017162272A1.

The positioning mark field can be located on the substrate holder fixing surface and/or on the substrate holder outer surface.

In a particularly preferred embodiment, the positioning mark field is located on the substrate holder fixing surface. This embodiment has the advantage that the depth of focus range of the positioning optics lies at the same level as the depth of focus range of the alignment optics, which are located in particular on the same side as the positioning optics.

In a still more preferred embodiment, the positioning mark field lies at the same level as the substrate surface to be bonded. Since the substrate has a certain thickness, the positioning mark field must either be raised relative to the substrate holder fixing surface, or the substrate holder fixing surface must be moved back slightly in the substrate holder. This can be achieved for example by milling with a milling depth which approximately corresponds to a mean substrate thickness.

In a general embodiment, a substrate holder has within a device 6 degrees of freedom, i.e. can be displaced in the x-, y- and z-direction, as well as being rotated in the x-, y- and z-axes. In a special embodiment, a substrate holder inside a device can preferably only move by a minimal number of degrees of freedom in order to minimise the error influence due to the devices which would permit the other degrees of freedom.

For several mentioned alignment systems, it is necessary for the optics to be moved very close to the alignment marks of a substrate. The substrate holder can therefore comprise holes, passages, drill holes, millings, recesses or indentations, referred to in the remainder of the publication by the umbrella term openings, in order to enable unhindered access for the optics, in particular also a degree of play for lateral displacements. Transparent materials can in particular also be inserted in the openings. This applies in particular to alignment systems according to publication WO2015082020A1.

Device

The devices are alignment systems. The different types of alignment system are split up into four types.

Type 1 is an alignment system which is based on the alignment principle of publication U.S. Pat. No. 6,214,692B1. In principle, it is a matter of displacing at least one of the substrate holders along a direction which in particular lies normal to the connecting line of two alignment marks and in the substrate surface. With this mode of procedure, the substrate holders are displaced along relatively long paths. The mutual displacement of the substrate holders in connection with the four alignment optics, whereof in each case two mutually opposite optics are calibrated to a focal point in a focal plane, permits the alignment of two substrates while the latter are located at a very small distance from one another.

Type 2 is an alignment system which is based on the alignment principle of publication WO2014202106A1. In principle, it is a matter of displacing both substrate holders crosswise along a direction which lies parallel to the connecting line of two alignment marks and in the substrate surface. The substrates, in contrast with type 1, are thus displaced "laterally". As a result of the lateral displacement, the displacements of the substrate holders are much shorter than in the type 1 alignment system. The mutual displacement of the substrate holders in connection with the four alignment optics, whereof two mutually opposite optics in each case are calibrated to a focal point in a focal plane, permits the alignment of two substrates when the latter are located at a very small distance from one another. Use is therefore preferably made of substrate holders, wherein the locally limited positioning mark fields are located beside the alignment marks of the substrate to be loaded.

Type 3 is an alignment system which is based on the alignment principle of publication WO2015082020A1. In principle, it is a matter of fixing the optics of one side, in particular the lower side, or at most permitting a movement in the z-direction, whereas the optics on the opposite, in particular upper, side are freely mobile in a plurality of directions, in particular at least in the x- and y-direction. Furthermore, in this type of alignment system, one of the substrate holders, in particular the lower one, is also mobile only in one direction, in particular the z-direction. In contrast with the alignment systems of type 1 and 2, the optics here are very readily moved after the calibration process, whereas the lower substrate at first remains fixed and is moved during the bonding process exclusively in the z-direction by the lower substrate holder.

All other types of alignment system which are based on optical principles are Type 4. Here, all kinds of positioning mark fields can in principle be used in any combination. The drawbacks of a positioning mark field applied on the substrate holder outer surface have already been described comprehensively in the section on the positioning mark field. The general type 4 alignment systems will therefore subsequently be dealt with only superficially in the publication. A type 4 alignment system would for example be the alignment system in publication WO2011042093A1. This publication describes an alignment system, in which a substrate holder can move over very long distances on a base, wherein the alignment optics are fastened either to the base and/or to the substrate holder etc.

An alignment system of type 3 with the corresponding extensions according to the invention is preferred.

In a very particularly preferred embodiment, the device comprises at least four alignment optics and at least one positioning optic, but preferably two positioning optics. On account of the symmetry aspects, two positioning optics are always used in the publication, in particular in the figures, although one would suffice.

In one embodiment, at least one of the substrate holders is provided as a substrate holder, i.e. with a positioning mark field.

In a very particularly preferred embodiment, both substrate holders are provided with a positioning mark field. Accordingly, the exact position of each substrate holder can be determined with corresponding positioning optics. Correspondingly more positioning optics, i.e. at least two, one above and one below, are required.

The device and the method are, generally, under no circumstances tied to any one of the mentioned types of alignment systems. The basic idea consists in the measurement and the creation of a correlation of alignment marks with positioning marks in positioning mark fields. Nonetheless, devices and processes for the various types of embodiment are explicitly described and represented in the figures. In particular, the idea is intended to be used to extend the alignment system of type 3, of WO2015082020A1.

Method

It is irrelevant whether the extended substrate holder or substrate holders are located at the upper side or lower side of the device. In order to remain consistent with the figures of the publication, it will be assumed in the remaining description that the substrate holder is an upper side substrate holder, i.e. the positioning mark field points downwards in the direction of gravity.

The calibration process generally precedes the methods. The calibration process should be carried out each time when it is assumed that the optical systems have been changed or displaced. The calibration processes are dependent on the employed type of alignment system. Possible calibration processes are for example disclosed comprehensively in publications WO2014202106A1 and WO2015082020A1 and are not dealt with in greater detail here.

Once the calibration process, provided for the given alignment system, has been concluded, the alignment process in particular can begin.

The method is in principle applicable to alignment systems wherein the substrates move in particular along a direction which (i) lies normal to the connecting line of two alignment marks and (ii) parallel to the substrate surface. This alignment system is described in U.S. Pat. No. 6,214,692B1 and denoted as type 1. The substrates have to travel over relatively long paths in order to make the alignment marks visible for the optics. The alignment marks are measured here, as it were, "in parallel".

In a first process step in an exemplary method according to the invention for the alignment of two substrates with an alignment system of type 1, a first substrate is loaded and fixed on a first, upper substrate holder.

In a second process step, the first, upper substrate holder is displaced until such time as the alignment marks of the first, upper substrate are located in the fields of vision of the lower alignment optics. In particular simultaneously, the lower positioning optics measure the upper positioning marks of the upper positioning mark field on the first, upper substrate holder, which is located in their fields of vision. From this point on, the first, upper substrate holder can be displaced along the entire length and can be brought into the same position by the renewed control of the upper positioning marks.

In a third process step, the first, upper substrate holder moves so far that the upper alignment optics, which it has hitherto concealed, have a free view downwards. In particular simultaneously or already in parallel with an earlier process step, a second substrate is loaded and fixed onto a second lower substrate holder. The loading of the second substrate can of course also take place at a much earlier point in time, in particular in parallel with one of the aforementioned process steps.

In a fourth process step, the second, lower substrate holder is displaced until such time as the alignment marks of the second, lower substrate are located in the fields of vision of the upper alignment optics. The second, lower substrate holder is then preferably no longer moved.

In a fifth process step, the first, upper substrate holder is again displaced back into the position determined in the second process step. Only the lower positioning optics are now used, which continuously measure the upper positioning mark field on the first, upper substrate holder and can thus control the desired position extremely precisely. In particular, the fine adjustment also takes place by means of the positioning optics, which are dealt with comprehensively in other parts of the publication.

In further process steps, the two substrates are then connected to one another by a suitable process. The connection process will not be dealt with in detail here. Fusion bonding processes are conceivable, wherein one of the two substrates, in particular the upper one, is curved by a curving means in order to make contact with the other substrate.

A first possible optional improvement of the aforementioned process is represented here in abbreviated form. The upper substrate holder has openings through which the upper alignment optics can view the lower substrate holder and therefore a lower loaded substrate. The lower substrate holder comprises a positioning mark field at its rear side. A substrate is loaded onto the lower substrate holder and the alignment marks of the lower substrate are measured through the openings of the upper substrate holder with the aid of the upper alignment optics. Lower positioning optics at the same time measure the positioning mark field on the rear side of the lower substrate holder. The upper substrate is then loaded. In particular simultaneously, the lower substrate holder moves so far that the lower alignment optics can measure the alignment marks of the upper substrate on the upper substrate holder. The lower substrate holder can then again be brought into the correct position with the aid of the positioning optics.

A second possible optional improvement of the aforementioned process is represented here in abbreviated form. The lower substrate holder comprises openings through which the lower alignment optics can view the upper substrate holder and therefore an upper loaded substrate. The upper substrate holder comprises a positioning mark field at its rear side. A substrate is loaded onto the upper substrate holder and the alignment marks of the upper substrate are measured through the openings of the lower substrate holder with the aid of the lower alignment optics. Upper positioning optics at the same time measure the positioning mark field on the rear side of the upper substrate holder. The lower substrate is then loaded. In particular simultaneously, the upper substrate holder moves so far that the upper alignment optics can measure the alignment marks of the lower substrate on the lower substrate holder. The upper substrate holder can then again be brought into the correct position with the aid of the positioning optics.

A combination of the two mentioned improvements is also feasible.

An improved embodiment of an alignment system and therefore also an improved method is described in WO2014202106A1 and denoted as type 2. Here, the substrates are also displaced with respect to one another, but along the direction of the connecting line of two alignment marks, i.e. "laterally", so that in each case a first alignment mark of a first substrate can always be detected by a second alignment optic and at the same time a second alignment mark of a second substrate can always be detected by a first alignment optic. The alignment marks are measured here as it were "crosswise". Slight changes in the flow of the process correspondingly arise. In particular, at least one substrate holder of the alignment system of type 2 is also extended by a positioning mark field.

In a first process step in an exemplary method according to the invention for the alignment of two substrates with an alignment system of type 2, a first substrate is loaded and fixed on a first, upper substrate holder. In particular simultaneously, a second substrate is loaded and fixed on a second, lower substrate holder. After the loading and fixing of the substrates, the substrate holders are brought into a position in which a left-hand lower alignment optic has a left-hand upper alignment mark of an upper substrate in its field of vision. For this purpose, it is necessary that the lower substrate holder is displaced so far to the right that the left-hand, lower alignment optic has a free view of the left-hand, upper alignment mark. At the same time, the left-hand lower positioning optic must have a left-hand upper positioning mark in its field of vision. The correlation between the left-hand, upper positioning mark and the left-hand upper alignment mark is thus produced.

In a second process step, the lower substrate holder now moves to the left and thus allows the right-hand, lower alignment optic and positioning optic to measure the right-hand, upper alignment mark and positioning mark. The correlation between the right-hand, upper positioning mark and the right-hand upper alignment mark is thus produced.

In a third process step, the second, lower substrate holder is displaced until such time as the left-hand alignment mark of the second, lower substrate is located in the field of vision of the upper, left-hand alignment optic. For this purpose, an opening can in particular be provided in the upper substrate holder. The second, lower substrate holder is preferably then no longer moved. The right-hand alignment mark of the lower substrate at the moment still concealed by the first, upper substrate holder should in particular be located in the field of vision of the right-hand upper alignment optic, as soon as the upper substrate holder frees the view of the lower right-hand alignment mark.

In a fourth process step, the first, upper substrate holder moves to the opposite, left-hand side until such time as the upper, right-hand alignment optic can view past it onto the lower right-hand alignment mark of the lower substrate. For this purpose, an opening can in particular also be provided in the upper substrate holder. This alignment mark should in fact already be located in the field of vision of the right-hand upper alignment optic. If this is not the case, the optics have been calibrated beforehand to an in particular false distance. The upper, right-hand alignment optic measures the lower, right-hand alignment mark. The lower substrate holder should no longer be moved.

In a fifth process step, the first, upper substrate holder is again displaced back into the position in which the left-hand, lower and the right-hand, lower positioning optic have the positioning marks on the left-hand and right-hand positioning mark field in the field of vision. Only the lower positioning optics are now used, which can measure the upper positioning mark field on the first, upper substrate holder and therefore can control the desired position extremely precisely. It is also of fundamental importance to understand that it is not necessary for the lower positioning optics to have the two positioning mark fields of the first, upper substrate holder continuously in the field of vision. As soon as the positioning marks of the positioning mark field again appear in the fields of vision of the lower positioning optics, the desired position can be controlled precisely and rapidly in the first place by coarse positioning. In particular, the fine adjustment also takes place by means of the positioning optics, which are dealt with more comprehensively in other parts of the publication.

In further process steps, the two substrates are then connected to one another by a suitable process. The connection process is not dealt with in greater detail here. Fusion bonding processes are conceivable, wherein one of the two substrates, in particular the upper one, is curved by means of a curving means in order to make contact with the other substrate.

In the next section, a particularly preferred process for a type 3 alignment system is described. This type of alignment system is described in publication WO2015082020A1. The application of the aspects according to the invention to this type of alignment system is of particular importance, since this alignment system represents the latest state of the art. The alignment system is characterised, like the previously described type 2, primarily by very short displacements of the substrate holders. However, the lower components, i.e. the lower alignment optics and the lower substrate holder, are designed here such that they can be displaced in particular only along the z-direction, i.e. along the height, whereas the upper alignment optics and the upper substrate holder have a maximum number of degrees of freedom, in particular in the x and y direction. The advantages that result from this are comprehensively described in publication WO2015082020A1.

An essential feature of the extended type 3 alignment system consists in the fact that the positioning mark fields are located along a line which is not parallel, in particular normal, to the connecting line of the alignment marks subsequently to be measured.

In a first process step in an exemplary method according to the invention for the alignment of two substrates with an alignment system of type 3, the upper substrate holder moves to the left. In particular simultaneously, a left-hand alignment optic moves upwards in the z-direction, until it has the left-hand alignment mark of the upper substrate in its field of vision and depth of focus range. In particular simultaneously, at least one positioning optic also moves upwards, until at least one positioning mark from one of the positioning mark fields is visible. It is thus possible to associate at least one positioning mark of at least one of the positioning mark fields with the left-hand alignment mark or to correlate the latter with one another.

In a second process step, the upper substrate holder moves to the right. In particular simultaneously, a right-hand alignment optic $6ur$ moves upwards in the z-direction, until it has the right-hand alignment mark of the upper substrate in its field of vision and depth of focus range. In particular simultaneously, at least one positioning optic also moves upwards, until at least one positioning mark from one of the positioning mark fields is visible. It is conceivable for the two positioning optics to be already located in position by means of the first process step. It is also conceivable that only one of the positioning optics was connected to the left-hand alignment optic in the first process step and therefore the corresponding second positioning optic now has to be brought into position. If the embodiment is to use only one positioning optic, the latter is already in position by means of the first process step and measures a second positioning mark of the same positioning mark field. It is thus possible to associate at least one further positioning mark with the right-hand alignment mark.

In a third process step, the lower substrate holder moves upwards. In particular simultaneously, the upper left-hand alignment optic moves in, generally, a number of directions in order to get the lower alignment mark of the lower substrate into the field of vision and the depth of focus range.

In a fourth process step, the substrate holder moves to the left. In particular simultaneously, the upper right-hand alignment optic moves in, generally, a number of directions in order to get the lower alignment mark of the lower substrate into the field of vision.

In a fifth process step, the upper substrate holder is aligned with respect to the lower substrate holder in such a way that the upper alignment marks are as congruent as possible with the lower alignment marks. The movement of the upper substrate holder is checked by means of at least one of the positioning optics, whereby at least one of the positioning mark fields is read out in particular continuously and evaluated. In particular, fine positioning is carried out by means of pixels. It is therefore possible to align the upper substrate with respect to the lower substrate, although the alignment marks are concealed by the respectively opposite substrates and are no longer visible.

An alignment system extended by the aspects according to the invention can in particular be based on all the types of alignment system. The corresponding methods, however, are slightly different from the corresponding process steps, so that the method is explicitly described in the figures for each of the two mentioned types of alignment.

Further advantages, features and details of the invention emerge from the following description of preferred examples of embodiment and with the aid of the drawings.

BRIEF DESCRIPTION OF THE DRAWINGS

FIG. 7a illustrates a first process step in a third alignment system according to the invention, FIG. 7b illustrates a second process step in a third alignment system, FIG. 7c illustrates a third process step in a third alignment system.

Identical components or components with the same function are denoted by the same reference numbers in the figures.

All the figures represent components and their features solely diagrammatically in a basic, rough manner. The figures are neither true to scale, nor are the features of the component necessarily designed as represented. The figures are therefore to be understood solely as schematic diagrams and their features are to be interpreted functionally under all circumstances.

DETAILED DESCRIPTION OF THE INVENTION

Figure 1:
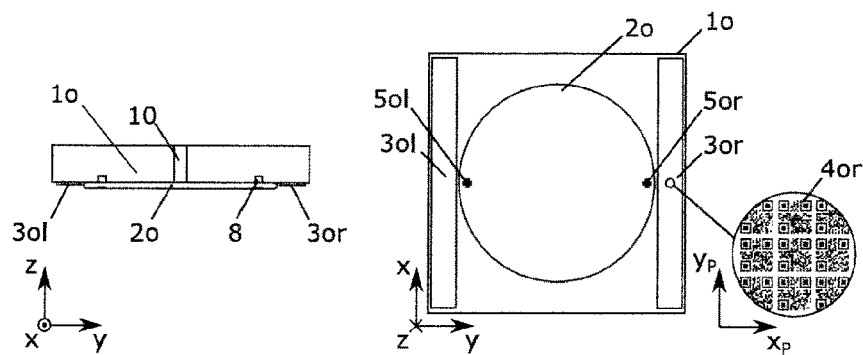
FIG. 1 shows a first substrate holder according to the invention.

FIG. 1 shows a first substrate holder 1o, with positioning mark fields 3ol, 3or, comprising a plurality of positioning marks 4ol, 4or, on which a substrate 2o with alignment marks 5ol, 5or has been fixed. Only positioning marks 4or are represented enlarged on the right-hand side. Accordingly, there are positioning marks 4ol on the left-hand side, the enlargement whereof is not represented on account of clarity and transparency. Positioning mark fields 3ol, 3or are located on the substrate holder fixing side, i.e. on the same side as fixed substrate 2o. Accordingly, positioning mark fields 3ol, 3or can be located only outside the fixing region for substrate 2o. Positioning mark fields 3ol, 3or are present in particular along a direction over the entire length of substrate 1, in the present case along the x-direction. It is however again mentioned that, for the adaptation of the type 1 alignment system too, such long positioning mark fields 3ol, 3or are not necessary and they can have a size just like positioning marks 3ol, 3or (see FIG. 2) in the extension of a type 2 alignment system. Since substrate holder 10 of the type 1 alignment system, which is described in the series of FIGS. 4a-4f, covers however further distances, positioning mark fields 3ol, 3or are represented constituted as an additional extension along the entire x-direction. This substrate holder 10 is used for alignment systems of type 1. Substrate holder 10 comprises fixing elements 8, as well as a deformation element 10. The latter are also mentioned and described merely in a rudimentary manner, since they are not of essential importance for the idea.

Figure 2:
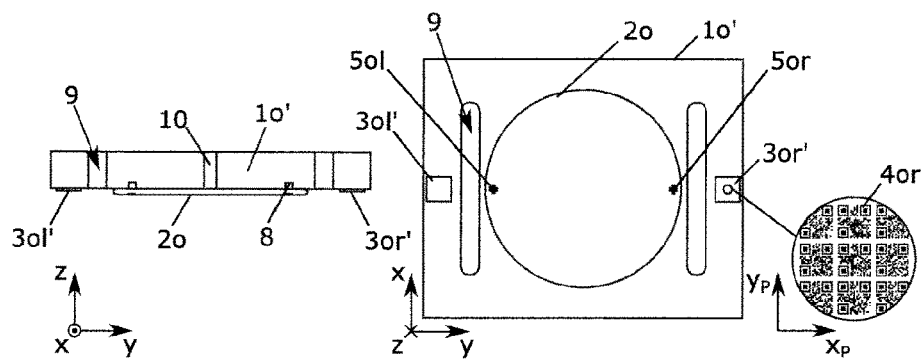
FIG. 2 shows a second substrate holder according to the invention.

FIG. 2 shows a second, preferred substrate holder 1o', with positioning mark fields 3ol', 3or', comprising a plurality of positioning marks 4ol, 4or, on which a substrate 2o with alignment marks 5ol, 5or has been fixed. Only positioning marks 4or are represented enlarged on the right-hand side. Accordingly, there are positioning marks 4ol on the left-hand side, the enlargement whereof is not represented for reasons of clarity and transparency. Positioning mark fields 3ol', 3or' are located on a substrate holder fixing side, i.e. on the same side as fixed substrate 2o. Accordingly, positioning mark fields 3ol', 3or' can be located only outside the fixing region for substrate 2o. Substrate holder 1o' preferably also comprises openings 9, which are in particular fully throughgoing milled slots, oblong holes, holes or drill holes, through which alignment optics 5ol, 5or can view through substrate holder 1o'. Openings 9 in particular simplify the process, which is represented in FIGS. 5a-5e. In particular, the required, mutual displacements of substrate holders 1o',1u thus become shorter. The process can also be implemented without openings 9, but is then less efficient, because in this case the required, mutual displacements of substrate holders 1o',1 are somewhat longer. For the sake of completeness, therefore, openings 9 are always shown. This substrate holder 1o' is used primarily for alignment systems of type 2 and type 3. Positioning mark fields 3ol', 3or' are smaller than positioning mark fields 3ol, 3or in FIG. 1. Substrate holder 1o' also comprises fixing elements 8, as well as a deformation element 10. The latter are also mentioned and described solely in a rudimentary manner, since they are not of essential importance for the idea.

Figure 3:
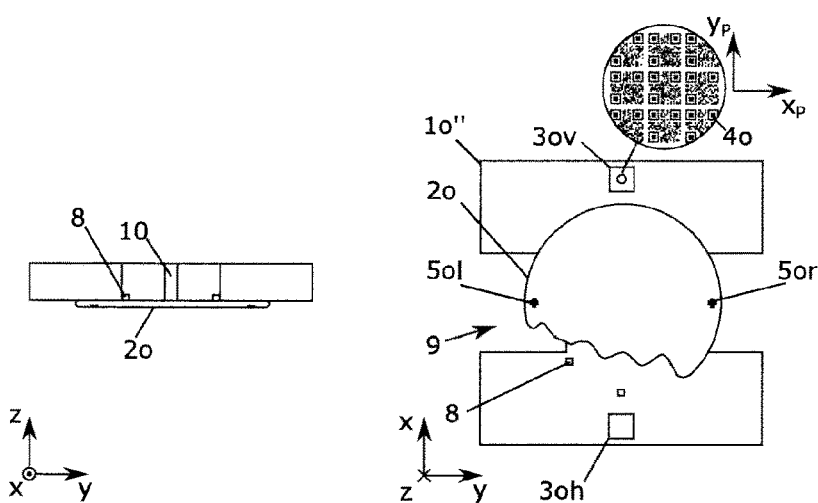
FIG. 3 shows a third substrate holder according to the invention.

FIG. 3 shows a third, still more preferred substrate holder 1o", with a front and a rear positioning mark field 3ov, 3oh comprising a plurality of positioning marks 4o. It can be seen that the connecting line between positioning mark fields 3ov, 3oh does not lie parallel to the connecting line between the two alignment marks 5ol, 5or, positioning mark fields 3ov, 3oh being rotated through 90° with respect to alignment marks 5ol, 5or. A characteristic feature of substrate 1o" is that alignment marks 5ol, 5or of upper substrate 2o are not located in line with positioning marks 3ov, 3oh, which are therefore denoted with indices v (front) and h (rear). This nomenclature facilitates the explanations in the following descriptions of the figures. Substrate holder 1o" also comprises fixing means 8, as well as a deformation element 10. These are also mentioned and described solely in a rudimentary manner, since they are not of essential importance for the idea. Second substrate holder 1o" also comprises openings 9, which allow the alignment optics very close access to the periphery of substrate 2o. This will be important for the method in the subsequently described process.

Figure 4:
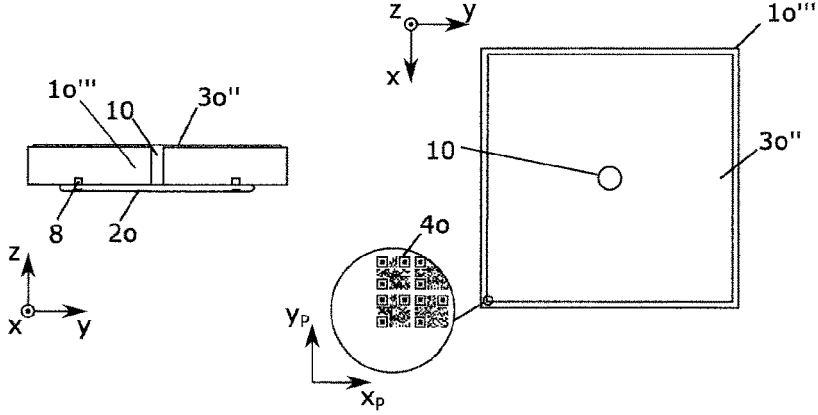
FIG. 4 shows a fourth substrate holder according to the invention.

FIG. 4 shows a fourth, less preferred substrate holder bow, with a single positioning mark field 3o‴, comprising a plurality of positioning marks 4o, on which a substrate 2o with alignment marks 5ol, 5or has been fixed. Positioning mark field 3o‴ is located on the substrate holder outer side. Accordingly, positioning mark field 3o‴ can be produced over a very large surface area. This substrate holder 1o‴ can be used for all types of alignment system. A drawback with this embodiment is primarily the fact that the depth of focus range of the alignment optics used (not shown) and of the positioning optics (not shown) cannot lie at the same level. The depth of focus ranges are separated from one another at least by height h of substrate holder 10'. The focal planes of alignment marks 5ol, 5or and of positioning marks 4o are thus also correspondingly very distant from one another. Positioning mark field 3o‴ does not of course have to extend over the entire substrate outer surface of substrate holder 1o‴, but rather can be localised and smaller. The extension over a very large area is only a further embodiment. Substrate holder 1o' also comprises fixing means 8, and a deformation element 10. These are also mentioned and described solely in a rudimentary manner, since they are not of essential importance for the idea.

The following descriptions of the figures serve to illustrate a process, in particular for devices of type 1.

For the sake of greater clarity, there are no cross-sections through FIGS. 5a-5e.

Figure 5A:
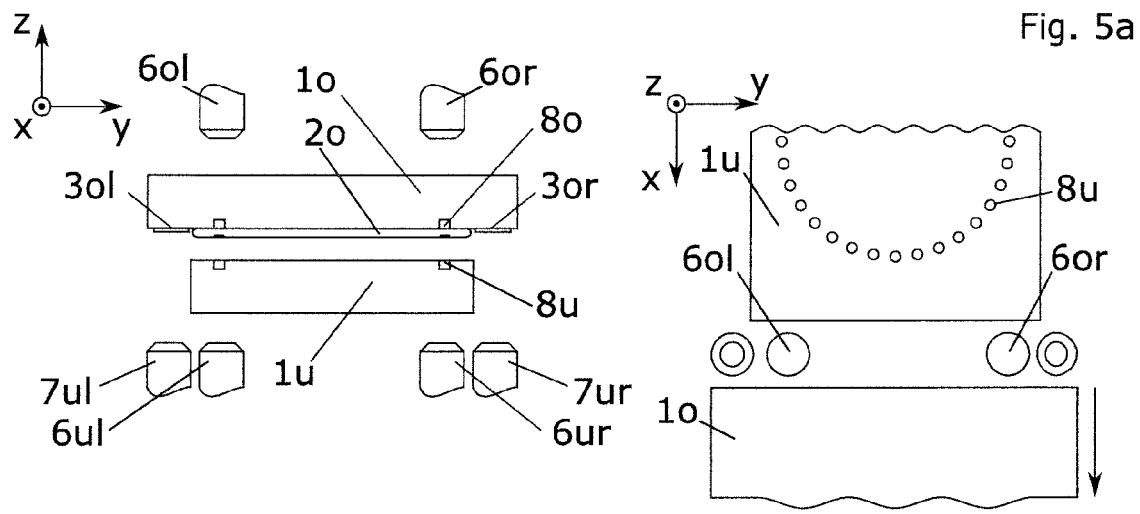
FIG. 5a illustrates a first process step in a first alignment system according to the invention.

FIG. 5a shows a first process step of a first process in a lateral representation (on the left) and in a plan view (on the right). An upper substrate holder 1o, with a positioning mark field 3ol on the left-hand side and a positioning mark field 3or on the right-hand side, moves into a loading position in order to receive and fix a substrate 2o. It would also be conceivable for substrate 2o to be fixed on substrate holder 10 without the latter moving. Accordingly, a robot would have to move substrate 2o into the appropriate position, in which it can be fixed by upper substrate holder 1o. The device in particular comprises two upper alignment optics 6ol, 6or, two lower alignment optics 6ul, 6ur and two lower positioning optics 7ul, 7or. In the plan view, fixing elements 8u can be seen on lower substrate holder 1u, with which a lower substrate 2u (not shown) is fixed in a subsequent process step. Alignment optics 6ol, 6or have already been calibrated with respect to lower alignment optics 6ul, 6ur according to a method from the prior art.

Figure 5B:
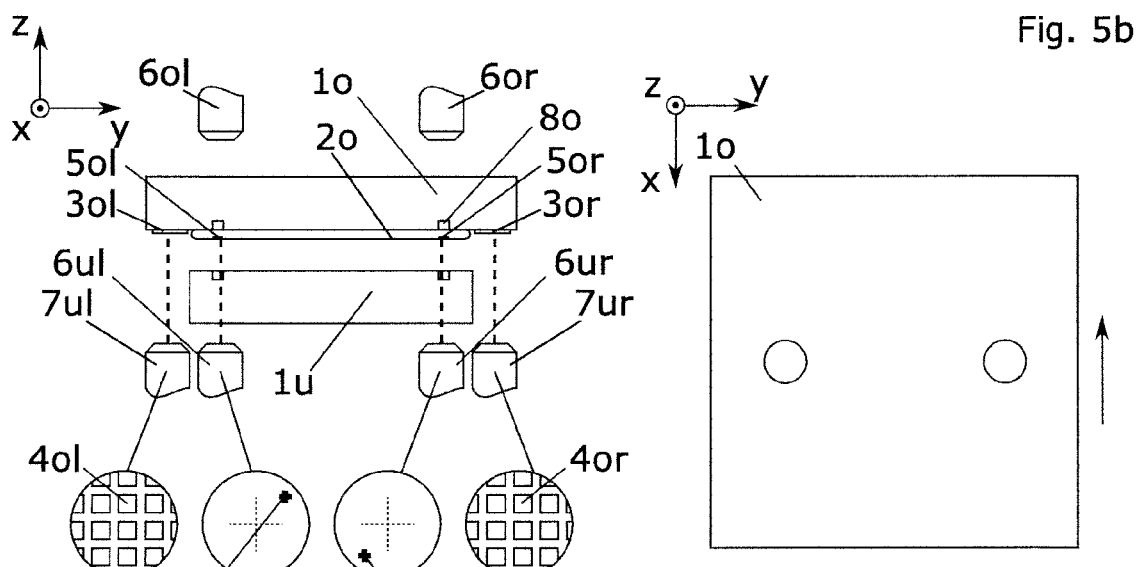
FIG. 5b illustrates a second process step in a first alignment system according to the invention.

FIG. 5b shows a second process step of a first process. Substrate holder 1o moves in the x-direction until such time as alignment marks 5ol, 5or are detected by alignment optics 6ul, 6ur and at least one positioning mark 4ol, 4or per positioning mark field 3ol, 3or is detected by positioning optics 7ul, 7ur. Positioning marks 4ol, 4or are now represented in the figures only in abstract form as a rectangle in order to simplify the representation. Since alignment optics 6ul, 6ur and positioning optics 7ul, 7ur are no longer moved, it can be determined at any time by the measurement of positioning marks 4ol, 4or of positioning mark fields 3ol, 3or where alignment marks 5ol, 5or are located relative to the optical axes of alignment optics 6ol, 6or, 6ul, 6ur. It must once again be mentioned that the depth of focus ranges of the optical axes of alignment optics 6ol, 6or, 6ul, 6ur have preferably been calibrated to a focal plane in preceding calibration processes. The point of intersection of the depth of focus ranges of the two left-hand alignment optics 6ol, 6ul represents the zero point for the left-hand side and the point of intersection of the depth of focus ranges of the two right-hand alignment optics 6or, 6ur represents the zero point for the right-hand side of the device.

Figure 5C:
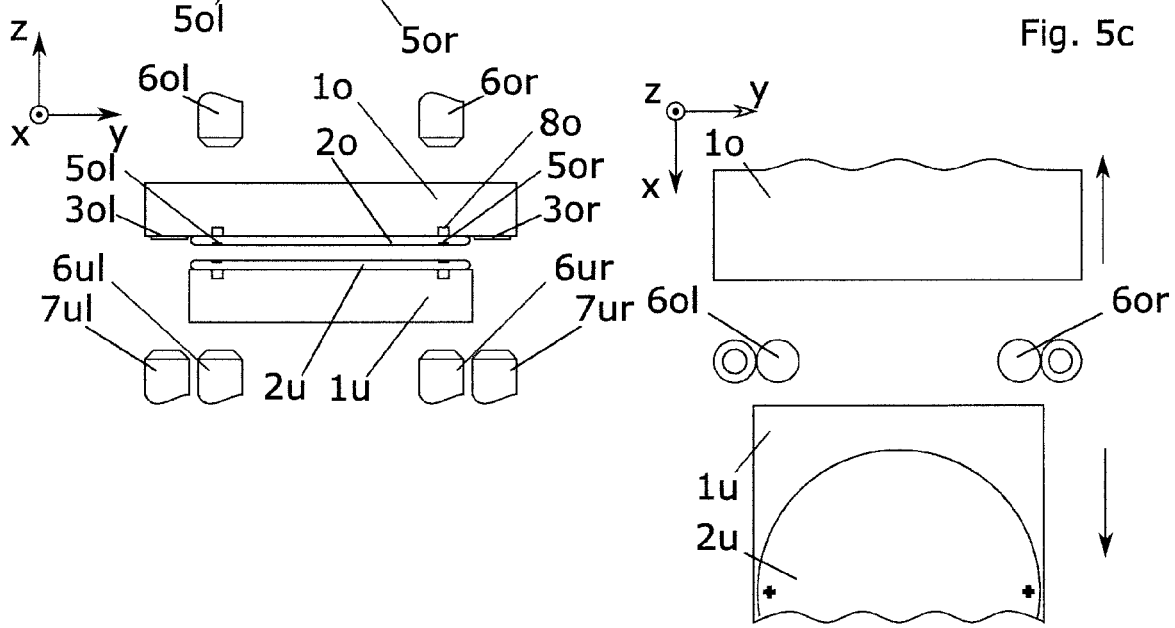
FIG. 5c illustrates a third process step in a first alignment system.

FIG. 5c shows a third process step of a first process. Upper substrate holder 1o moves so far that it is no longer in the way of upper alignment optics 6ol, 6or. In particular simultaneously, a lower substrate holder 1u moves into a loading position and is loaded with a lower substrate 2u. Lower substrate holder 1u fixes lower substrate 2u. It would of course be conceivable in this case too for lower substrate holder 1u not to be moved and for lower substrate 2u to be deposited, in particular positioned, by a robot. It is of course also conceivable for lower substrate 2u to have already been loaded onto lower substrate holder 1u.

Figure 5D:
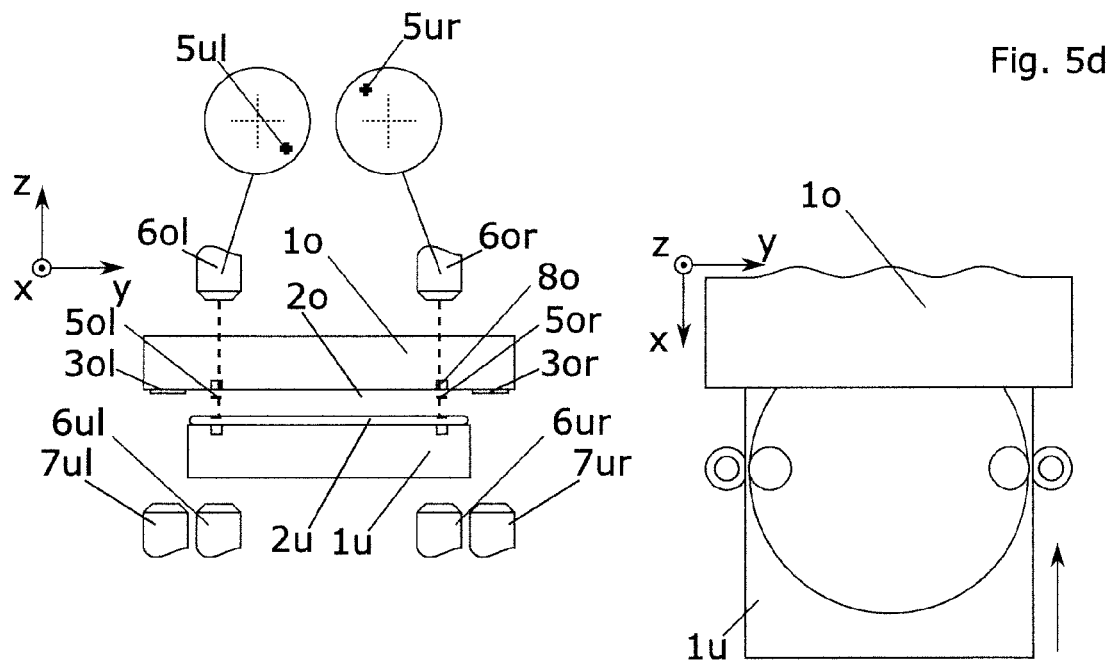
FIG. 5d illustrates a fourth process step in a first alignment system.

FIG. 5d shows a fourth process step of a first process, in which lower substrate holder 1u moves until such time as lower alignment marks 5ul, 5ur are located in the field of vision of upper alignment optics 6ol, 6or. Since upper substrate holder 1o was moved out of the fields of vision of upper alignment optics 6ol, 6or in the previous process step, the substrate surface of substrate 2u can be measured. Once lower substrate holder 1u has been positioned, it is no longer moved.

Figure 5E:
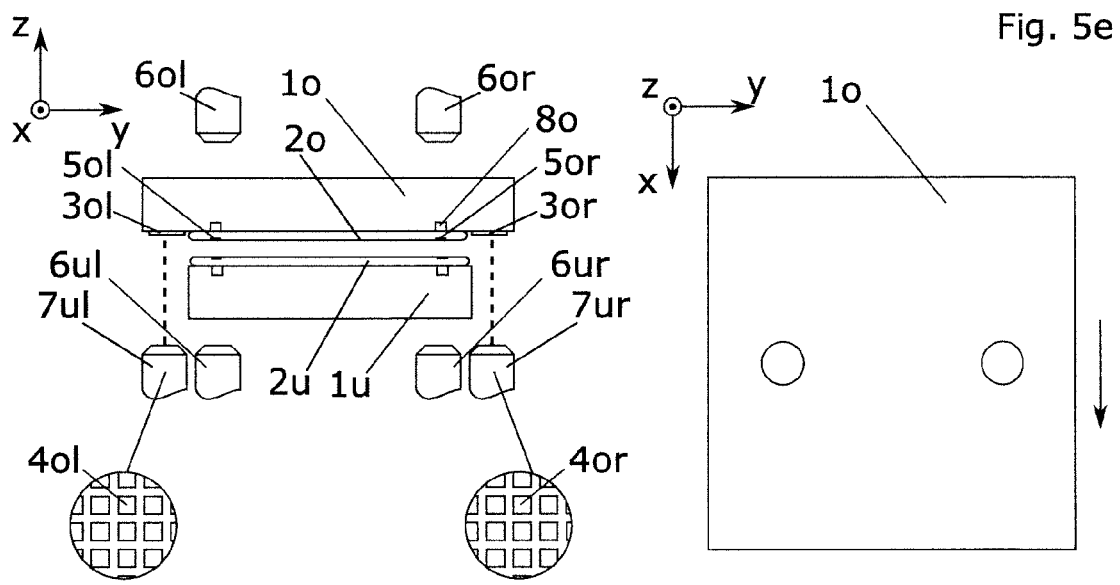
FIG. 5e illustrates a fifth process step in a first alignment system.

FIG. 5e shows a fifth process step of a first process, in which upper substrate holder 1o is again moved back into its initial position. Positioning marks 4ol, 4or of positioning mark fields 3ol, 3or are measured in order to acquire precise knowledge concerning the position of upper alignment marks 5ol, 5or which are in the meantime concealed. The position of lower alignment marks 5ul, 5ur must of course still be known, since lower substrate holder 1u has no longer moved. By viewing positioning marks 4ol, 4or of positioning mark fields 3ol, 3or, it is therefore possible to align left-hand alignment marks 5ol, 5ul and right-hand alignment marks 5or, 5ur by a position displacement of upper substrate holder 1o. Upper substrate holder 1o can thus preferably be moved in more than one degree of freedom. In further process steps, the approach of substrates 2o, 2u towards one another then takes place, as well as their bonding process. These process steps are no longer represented explicitly, since they no longer have anything in particular to do with the idea.

The following descriptions of the figures serve to represent a process, in particular for devices of type 2. The characteristic feature of type 2 alignment systems consists in the fact that substrate holders 1o, 1u move laterally, in particular crossing over.

For the sake of better clarity, cross-sections of FIGS. 6a-6e are not shown.

Figure 6A:
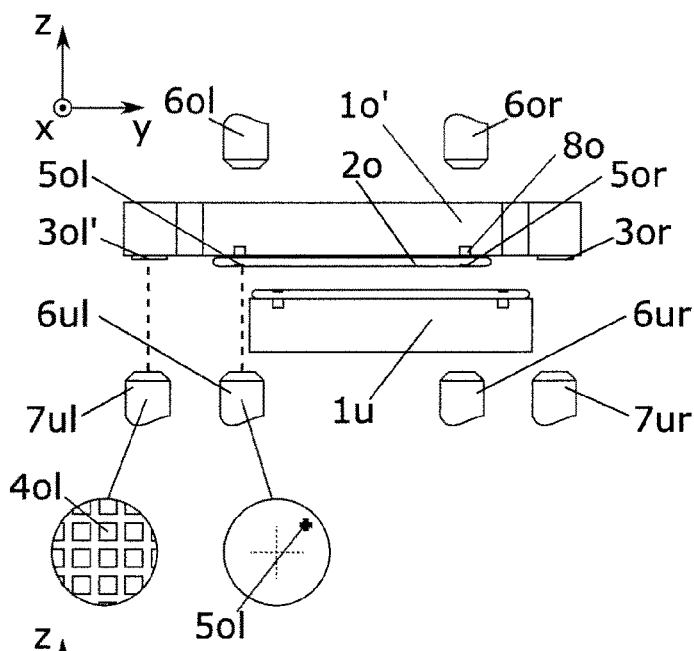
FIG. 6a illustrates a first process step in a second alignment system according to the invention.

FIG. 6a shows a first process step of a second process, in which lower substrate holder 1u is displaced to one side, in particular the right-hand side. Left-hand alignment optic 6ul measures a left-hand alignment mark 5ol of upper substrate 2o. At the same time, left-hand positioning optic 7ul measures a left-hand positioning mark 4ol of a left-hand positioning mark field 3ol'.

Figure 6B:
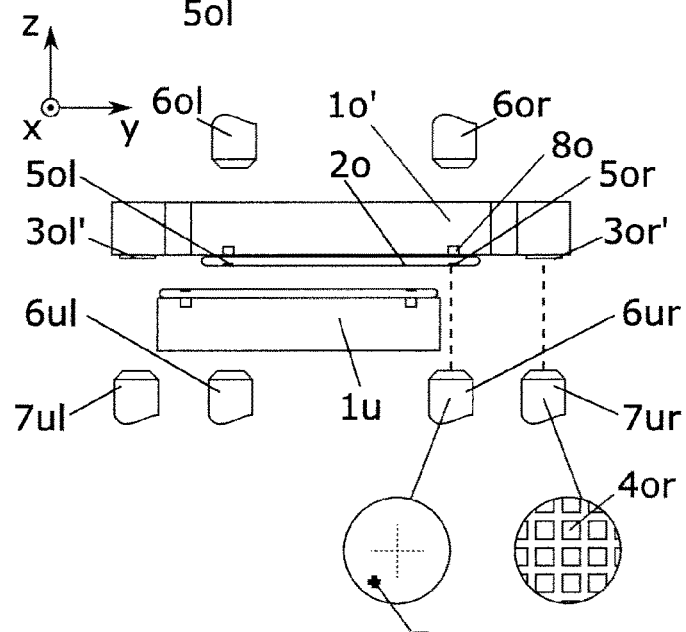
FIG. 6b illustrates a second process step in a second alignment system.

FIG. 6b shows a second process step of a second process, in which lower substrate holder 1u is displaced to the opposite, in particular the left-hand, side. The right-hand alignment optic 6ur measures a right-hand alignment mark 5or of upper substrate 2o. At the same time, right-hand positioning optic 7ur measures a right-hand positioning mark 4or of a right-hand positioning mark field 3or'.

Figure 6C:
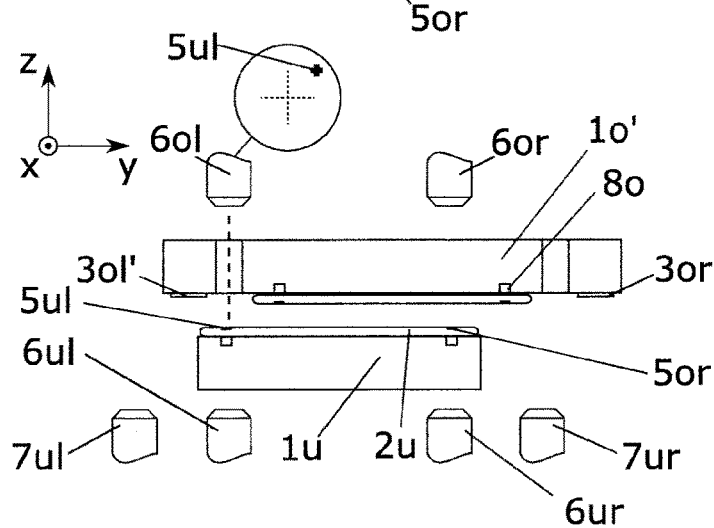
FIG. 6c illustrates a third process step in a second alignment system.

FIG. 6c shows a third process step of a second process, in which lower substrate holder 1u is displaced again into its original starting position. In particular simultaneously, upper substrate holder 1o' is moved to the right until such time as upper left-hand alignment optic 6ol has a free view through openings 9 onto lower alignment mark 5ul of lower substrate 2u. The position of lower alignment mark 5ul relative to the left-hand optical axis is stored.

Figure 6D:
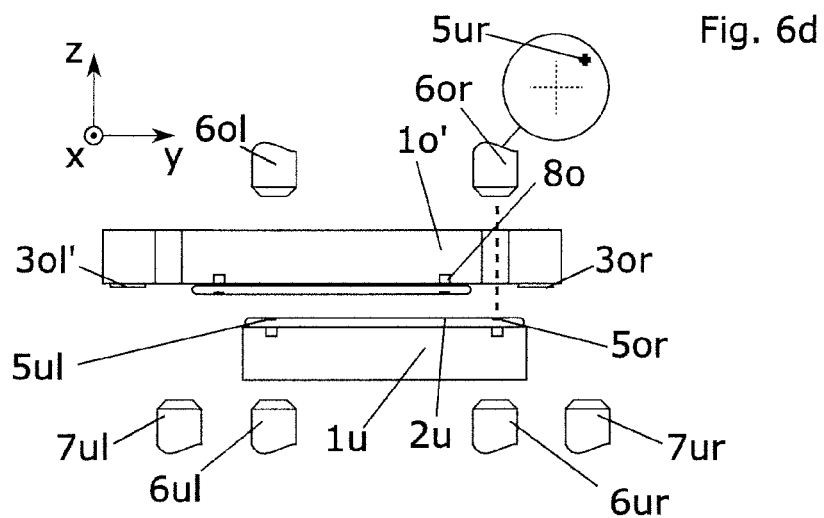
FIG. 6d illustrates a fourth process step in a second alignment system.

FIG. 6d shows a fourth process step of a second process, in which upper substrate holder 1o' is moved to the left until such time as upper right-hand alignment optic 6or has a free view through openings 9 onto lower alignment mark 5ur of lower substrate 2u. The position of lower alignment mark 5ur relative to the right-hand optical axis is stored.

The process steps in FIGS. 5c and 5d presuppose that the lower substrate holder has been moved back into its original position in process step two according to FIG. 5b, such that the two alignment marks 5ul, 5ur are located in the field of vision of alignment optics 6ol, 6or. If this is not the case for at least one of alignment marks 5ul, 5ur, lower substrate 2u must be duly repositioned and process steps three and four are repeated.

Substrate holder 2u may no longer be moved after this process step.

Figure 6E:
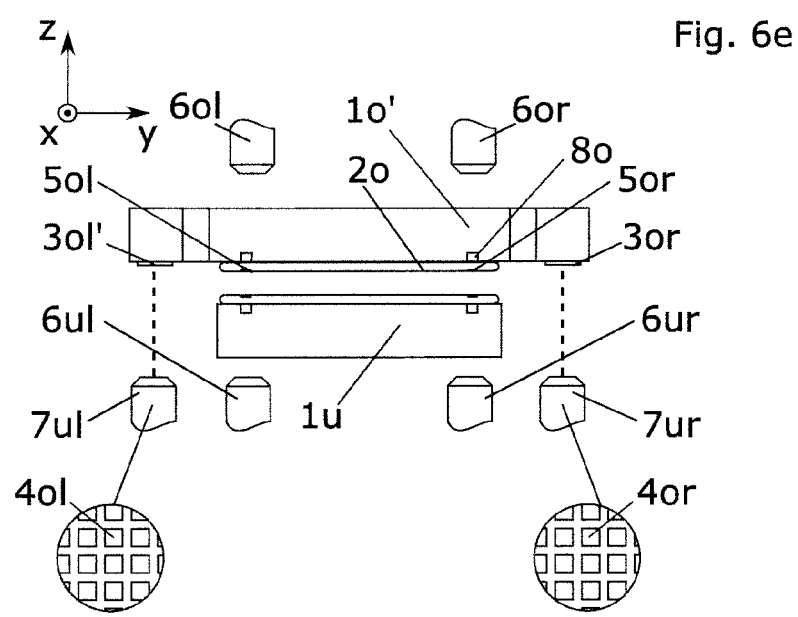
FIG. 6e illustrates a fifth process step in a second alignment system.

FIG. 6e shows a fifth process step of a second process, in which upper substrate holder 1o' is moved back again into its original position until such time as positioning mark fields 3ol' 3or' appear in the fields of vision of lower positioning optics 7ul, 7ur. From this time on, upper alignment marks 5ol, 5or can be aligned with respect to lower alignment marks 5ul, 5ur, whereby the automatic control brings upper substrate holder 1o' into the correct position by the position measurement by means of positioning marks 4ol, 4or. This process is a fine-adjustment process which is described in greater detail in FIGS. 8a-b for all types of alignment system.

In further process steps, the approach and the actual bonding process of the two substrates then takes place. These process steps are not described in greater detail, since they are no longer relevant for the idea.

The processes described in FIGS. 5a-6e for types 1 and 2 are based independently of the idea primarily on the principle of the calibration of all the alignment optics on a focal plane. The optics are no longer moved after the calibration.

The situation is wholly different in the case of the alignment system of type 3. Here, the lower alignment optics are designed such that they can be moved solely in the z-direction, whereas the upper alignment optics can be moved in the x-, y- and preferably also in the z-direction. Furthermore, the lower substrate holder has only one movement in the z-direction, whereas the upper substrate holder has degrees of freedom in the x-, y- and preferably also in the z-direction as well as about three rotational axes. Accordingly, the idea also has an effect here on the process steps.

In the following figures, a side view (on the left), along the X-direction, and a front view (on the right), along with the Y-direction, are represented.

For the sake of greater clarity, cross-sections of FIGS. 7a-7e are shown this time.

Alignment optics 6ul, 6ur, 6ol, 6or and positioning optics 7uv, 7uh are preferably all able to be positioned, rotated and controlled independently of one another.

FIG. 7a shows a first process step of a third process. Upper substrate holder 1o" moves to the left. In particular simultaneously, a left-hand alignment optic 6ul moves in the z-direction upwards, until it has left-hand alignment mark 5ol of upper substrate 2o in its field of vision and depth of focus range. In particular simultaneously, at least one positioning optic 7uv, 7uh also moves upwards, until at least one positioning mark 4o from one of positioning mark fields 3ov, 3oh is visible. It thus becomes possible to associate at least one positioning mark 4o from at least one of positioning mark fields 3ov, 3oh with left-hand alignment mark 5ol. The movement of alignment optic 6u and positioning optics 7uv, 7uh is of course not necessary, if the device is designed such that the depth of focus range can already detect alignment mark 5ol and positioning mark fields 3ov, 3oh.

FIG. 7b shows a second process step of a third process. Upper substrate holder 1o" moves to the right. In particular simultaneously, a right-hand alignment optic 6ur moves in the z-direction upwards, until it has right-hand alignment mark 5or of upper substrate 2o in its field of vision and its depth of focus range. In particular simultaneously, at least one positioning optic 7uv, 7uh moves upwards, until at least one positioning mark 4o from one of positioning mark fields 3ov, 3oh is visible. It is conceivable that the two positioning optics 7uv, 7uh are already located in position by means of the first process step. It is also conceivable that only one of positioning optics 7uh, 7uv was connected in the first process step to left-hand alignment optic 6ul and so the correspondingly second positioning optic must now be brought into position. If the embodiment makes use of only one positioning optic 7uv or 7uh, the latter is already in position by means of the first process step and measures a second positioning mark 4o of same positioning mark field 3ov or 3oh. It thus becomes possible to associate at least one further positioning mark 4o with right-hand alignment mark 5or. The movement of alignment optic 6ur and positioning optics 7uv, 7uh is of course not necessary, if the device is designed such that the depth of focus range can already detect alignment mark 5or and positioning mark fields 3ov, 3oh.

FIG. 7c shows a third process step of a third process. Lower substrate holder 1u moves upwards. In particular simultaneously, upper left-hand alignment optic 6ol moves in, generally, a plurality of directions in order to get lower alignment mark 5ul of lower substrate 2u into the field of vision and the depth of focus range.

Figure 7D:
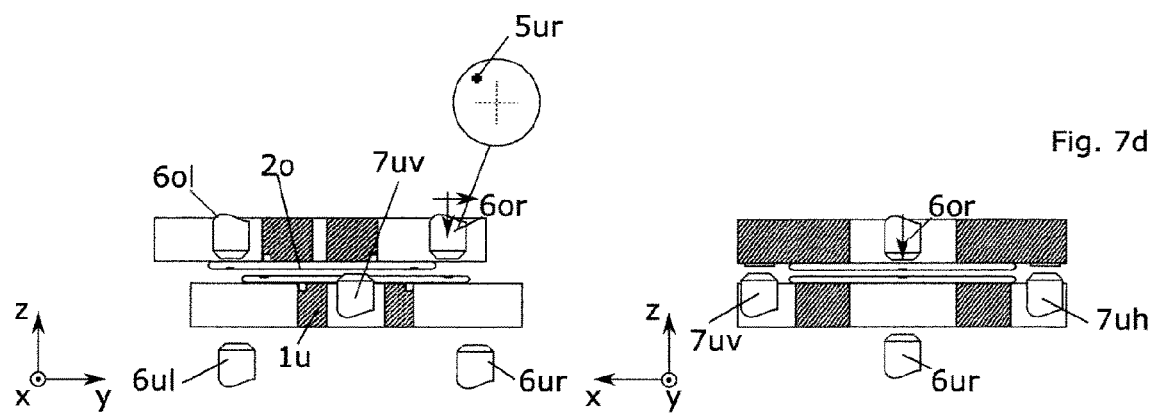
FIG. 7d illustrates a fourth process step in a third alignment system.

FIG. 7d shows a fourth process step of a third process. Upper substrate holder 1o moves to the left. In particular simultaneously, upper right-hand alignment optic 6or moves in, generally, a plurality of directions in order to get lower alignment mark 5ur of lower substrate 2u into the field of vision.

Figure 7E:
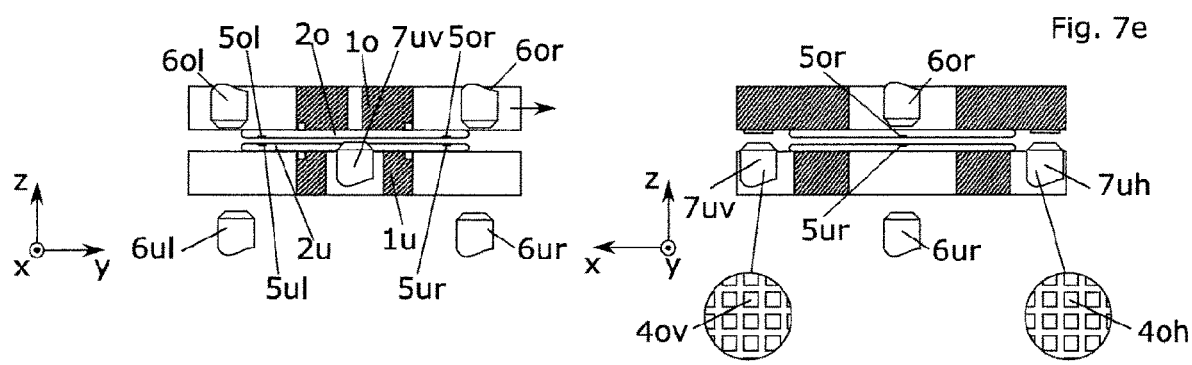
FIG. 7e illustrates a fifth process step in a third alignment system.

FIG. 7e shows a fifth process step of a third process. Upper substrate holder 1o is aligned with respect to lower substrate holder 1u, such that upper alignment marks 5ol, 5or are as congruent as possible with respect to lower alignment marks 5ul, 5ur. The movement of upper substrate holder 1o is checked by at least one of positioning optics 7uv and 7uh, whereby at least one of positioning mark fields 3ov, 3oh is continuously read out and evaluated. In particular, fine positioning by means of pixels is carried out. It is therefore possible for upper substrate 2o to be aligned with respect to lower substrate 2u, although alignment marks 5ul, 5ur, 5ol, 5or are concealed by the respectively opposite substrate and are no longer visible.

Figure 8A:
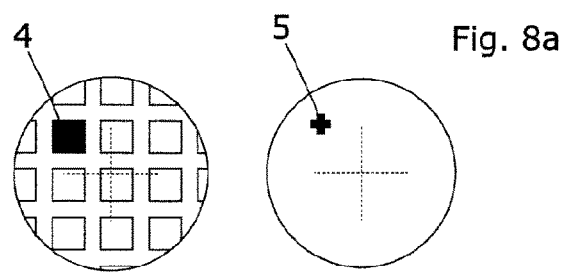
FIG. 8a illustrates a first process step of a fine-alignment process and FIG. 8b illustrates a second process step of a fine-alignment process.

FIG. 8a shows a state in which a positioning mark 4 is visible in the field of vision (left-hand image) of a positioning optic (not shown). An alignment mark 5 was able to be measured at any point in time in the field of vision (right-hand image) of an alignment optic (not shown).

Figure 8B:
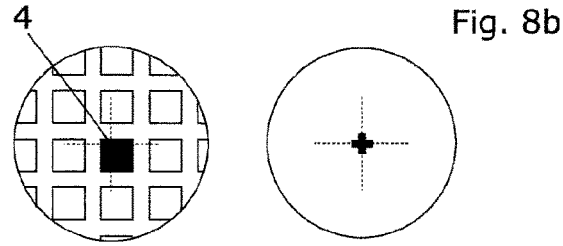

FIG. 8b shows a state in which a positioning mark 4 is visible in the field of vision (left-hand image) of a positioning optic (not shown), which positioning mark has been displaced by a relative displacement of a substrate holder (not shown) until such time as alignment mark 5 is located in a desired position. For the sake of clarity, the desired position for alignment mark 5 has been selected such that it lies on the optical axis of the alignment optic (not shown). The measurement of positioning mark 4 can take place with pixel precision and is therefore used for the fine positioning.

LIST OF REFERENCE NUMBERS 1o, 1o', 1o", 1o''', 1u substrate holder
2o, 2u substrate
3ol, 3or, 3ol', 3or', 3o", 3ov, 3oh positioning mark field
4, 4o, 4ol, 4or, 4oh, 4ov positioning mark
5, 5ol, 5or, 5ul, 5ur alignment mark
6ol, 6or, 6ul, 6ur alignment optic
7ul, 7ur, 7uv, 7uh positioning optic
8, 8o, 8u fixing elements
9 openings
10 deformation element

What is claimed is:

1. A device for the alignment of a first substrate and a second substrate, the first substrate having at least two alignment marks, the second substrate having at least two alignment marks, said device comprising:
   a first substrate holder for receiving the first substrate;
   a second substrate holder for receiving the second substrate;
   at least one alignment optic for detecting the alignment marks; and
   at least one positioning optic for detecting positioning marks arranged on the first substrate holder in areas of the first substrate holder that are viewable by the at least one positioning optic and unopposed by the second substrate holder,
   wherein the first substrate holder and the second substrate holder face each other,
   wherein the second substrate holder has a narrower footprint than the first substrate holder, and
   wherein the alignment marks of the first substrate and the alignment marks of the second substrate are alignable with one another depending on the positioning marks.

2. The device according to claim 1, wherein the alignment marks of the first and second substrates are alignable with one another by means of the positioning marks, when one or more of the at least two alignment marks of the first substrate is concealed by the second substrate for the at least one alignment optic and/or when one or more of the at least two alignment marks of the second substrate is concealed by the first substrate for the at least one alignment optic.

3. The device according to claim 1, wherein a positioning mark field is formed by the positioning marks.

4. The device according to claim 3, wherein the positioning marks are arranged regularly.

5. The device according to claim 3, wherein the position of different positioning marks, in the positioning mark field formed by the positioning marks, relative to one another is known.

6. The device according to claim 1, wherein the positioning marks are formed by a multiplicity of fine-positioning elements.

7. The device according to claim 6, wherein the fine-positioning elements are arranged irregularly.

8. The device according to claim 1, wherein each of said positioning marks is formed differently.

9. The device according to claim 8, wherein the positioning marks have a specific information content.

10. The device according to claim 9, wherein the specific information content is detectable by the positioning optic.

11. The device according claim 1, wherein the positioning marks have one or more of the following shapes:
   a QR Code,
   a bar code,
   a geometrical figure,
   a character string, and
   an image.

12. The device according to claim 11, wherein the geometrical figure is three-dimensional.

13. The device according to claim 11, wherein the character string is a letter sequence and/or a number sequence.

14. The device according to claim 11, wherein the character string is a binary code.

15. The device according to claim 1, wherein at least one of the first and second substrate holders and/or the at least one positioning optic is moveable in at least two directions.

16. The device according to claim 15, wherein the at least two directions are x-direction and y-direction.

17. The device according to claim 1, wherein the positioning marks are arranged laterally beside the first substrate.

18. The device according to claim 17, wherein the positioning marks are arranged laterally beside the first substrate such that the alignment marks of the first and second substrates are alignable with one another when the alignment marks of said substrates are concealed for the at least one alignment optic by the other substrate.

19. The device according to claim 1, wherein the positioning marks are arranged on a surface of the first substrate holder.

20. The device according to claim 1, wherein the positioning marks are arranged at a same level as a substrate surface of the first substrate.

21. The device according to claim 1, wherein positions of the alignment marks of the first and second substrates are detectable by the at least one positioning optic during alignment of the alignment marks of the first and second substrates with one another.

22. The device according to claim 21, wherein the positions of the alignment marks of the first and second substrates are continuously detectable by the at least one positioning optic during the alignment of the alignment marks of the first and second substrates with one another.

23. A method for alignment of first and second substrates, the first substrate having at least two alignment marks, the second substrate having at least two alignment marks, the method comprising:
- respectively receiving the first and second substrates on first and second substrate holders;
- respectively fixing the first and second substrates on the first and second substrate holders;
- detecting the alignment marks on the first and second substrates using at least one alignment optic;
- detecting positioning marks arranged on the first substrate holder using at least one positioning optic, the positioning marks being arranged on the first substrate holder in areas of the first substrate holder that are viewable by the at least positioning optic and unopposed by the second substrate holder; and
- aligning the alignment marks of the first substrate and the alignment marks of the second substrate with one another depending on the positioning marks,
- wherein the first substrate holder and the second substrate holder face each other, and
- wherein the second substrate holder has a narrower footprint than the first substrate holder.

24. The method for alignment of the first and second substrates according to claim 23, wherein, after the detecting the positioning marks, determining a position of the alignment marks and/or a location of the alignment marks relative to one another.

* * * * *